(12) United States Patent
Nakagawa

(10) Patent No.: US 12,346,017 B2
(45) Date of Patent: Jul. 1, 2025

(54) SUBSTRATE WITH MULTILAYER REFLECTIVE FILM, REFLECTIVE MASK BLANK, REFLECTIVE MASK, AND METHOD FOR MANUFACTURING SEMICONDUCTOR DEVICE

(71) Applicant: HOYA CORPORATION, Tokyo (JP)

(72) Inventor: Masanori Nakagawa, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 119 days.

(21) Appl. No.: 17/761,100

(22) PCT Filed: Sep. 23, 2020

(86) PCT No.: PCT/JP2020/035728
§ 371 (c)(1),
(2) Date: Mar. 16, 2022

(87) PCT Pub. No.: WO2021/060253
PCT Pub. Date: Apr. 1, 2021

(65) Prior Publication Data
US 2022/0342293 A1    Oct. 27, 2022

(30) Foreign Application Priority Data
Sep. 26, 2019   (JP) .................................. 2019-175851

(51) Int. Cl.
*G03F 1/24* (2012.01)
*G03F 1/58* (2012.01)
*G03F 1/76* (2012.01)

(52) U.S. Cl.
CPC .................. *G03F 1/24* (2013.01); *G03F 1/58* (2013.01); *G03F 1/76* (2013.01)

(58) Field of Classification Search
None
See application file for complete search history.

(56) References Cited

U.S. PATENT DOCUMENTS

| 5,310,603 A | 5/1994 | Fukuda et al. |
| 5,319,695 A | 6/1994 | Itoh et al. |

(Continued)

FOREIGN PATENT DOCUMENTS

| JP | H05297194 A | 11/1993 |
| JP | H07097159 B2 | 10/1995 |

(Continued)

OTHER PUBLICATIONS

Rane et al., "Microstructure, electrical resistivity and stresses in sputter deposited W and Mo films and the influence of the interface on bilayer properties", Thin Solid Films, vol. 571, Pt 1, pp. 1-8 (Nov. 2014).*

(Continued)

*Primary Examiner* — Martin J Angebranndt
(74) *Attorney, Agent, or Firm* — Sughrue Mion, PLLC

(57) ABSTRACT

Provided is a substrate with a multilayer reflective film, the substrate being used for manufacturing a reflective mask blank and a reflective mask each having a multilayer reflective film having a high reflectance to exposure light and a low background level during defect inspection.
A substrate with a multilayer reflective film 110 comprises a substrate 1 and a multilayer reflective film 5. The multilayer reflective film 5 is formed of a multilayer film in which a low refractive index layer and a high refractive index layer are alternately layered on the substrate 1. The multilayer reflective film 5 comprises at least one additive element selected from hydrogen (H), deuterium (D), and helium (He). The additive element in the multilayer reflective film 5 has an atomic number density of 0.006 atom/$nm^3$ or more and 0.50 atom/$nm^3$ or less.

12 Claims, 2 Drawing Sheets

(56) References Cited

U.S. PATENT DOCUMENTS

| | | | |
|---|---|---|---|
| 5,433,988 A | | 7/1995 | Fukuda et al. |
| 11,256,167 B2 | * | 2/2022 | Nakagawa ................ G03F 1/84 |
| 11,650,494 B2 | * | 5/2023 | Nakagawa ................ G03F 1/24 430/5 |
| 2011/0189593 A1 | * | 8/2011 | Ogawa ...................... G03F 1/24 118/712 |
| 2014/0170536 A1 | | 6/2014 | Fukugami et al. |
| 2016/0012929 A1 | | 1/2016 | Kuznetsov et al. |
| 2017/0168383 A1 | | 6/2017 | Hofmann et al. |
| 2020/0218143 A1 | | 7/2020 | Komizo et al. |
| 2020/0310244 A1 | * | 10/2020 | Nakagawa ................ G03F 1/84 |
| 2023/0072220 A1 | * | 3/2023 | Nakagawa ................ G03F 7/20 |

FOREIGN PATENT DOCUMENTS

| | | | | |
|---|---|---|---|---|
| JP | 2004333711 A | | 11/2004 | |
| JP | 2006013280 A | | 1/2006 | |
| JP | 2006523038 A | * | 10/2006 | |
| JP | 2008101916 A | | 5/2008 | |
| JP | 2010280931 A | | 12/2010 | |
| JP | 2012212787 A | * | 11/2012 | |
| JP | 2013122952 A | | 6/2013 | |
| JP | 2014229825 A | * | 12/2014 | |
| JP | 2016514279 A | | 5/2016 | |
| JP | 2016519329 A | | 6/2016 | |
| JP | 2019109277 A | | 7/2019 | |
| KR | 20100035559 A | * | 4/2010 | |
| TW | 201734651 A | * | 10/2017 | ........... G02B 5/0816 |
| TW | 201907223 A | | 2/2019 | |
| WO | 2010/113787 A1 | | 10/2010 | |
| WO | 2013027412 A1 | | 2/2013 | |

OTHER PUBLICATIONS

Marquez et al., "Spectroscopic ellipsometry study of non-hydrogenated fully amorphous silicon films deposited by room-temperature radio-frequency magnetron sputtering on glass: Influence of the argon pressure", J. non-crystal. Sol. vol. 547, articles 120305 (12 pages) (Jul. 2020).*

PCT/JP2020/035728, "English Translation of International Search Report", Dec. 8, 2020, 2 pages.

TW109132882, "Office Action", Apr. 11, 2024, 6 pages.

Kuznetsov et al., "Hydrogen Interaction with EUVL-Relevant Optical Materials", Journal of Surface Investigation, X-ray, Synchrotron and Neutron Techniques, vol. 4, No. 4, 2010, pp. 563-566, DOI: 10.1134/S1027451010040026.

Communication issued Apr. 2, 2025 in Korean Application No. 10-2022-7007436.

Communication issued Apr. 10, 2025 in Chinese Application No. 202080066022.1.

* cited by examiner

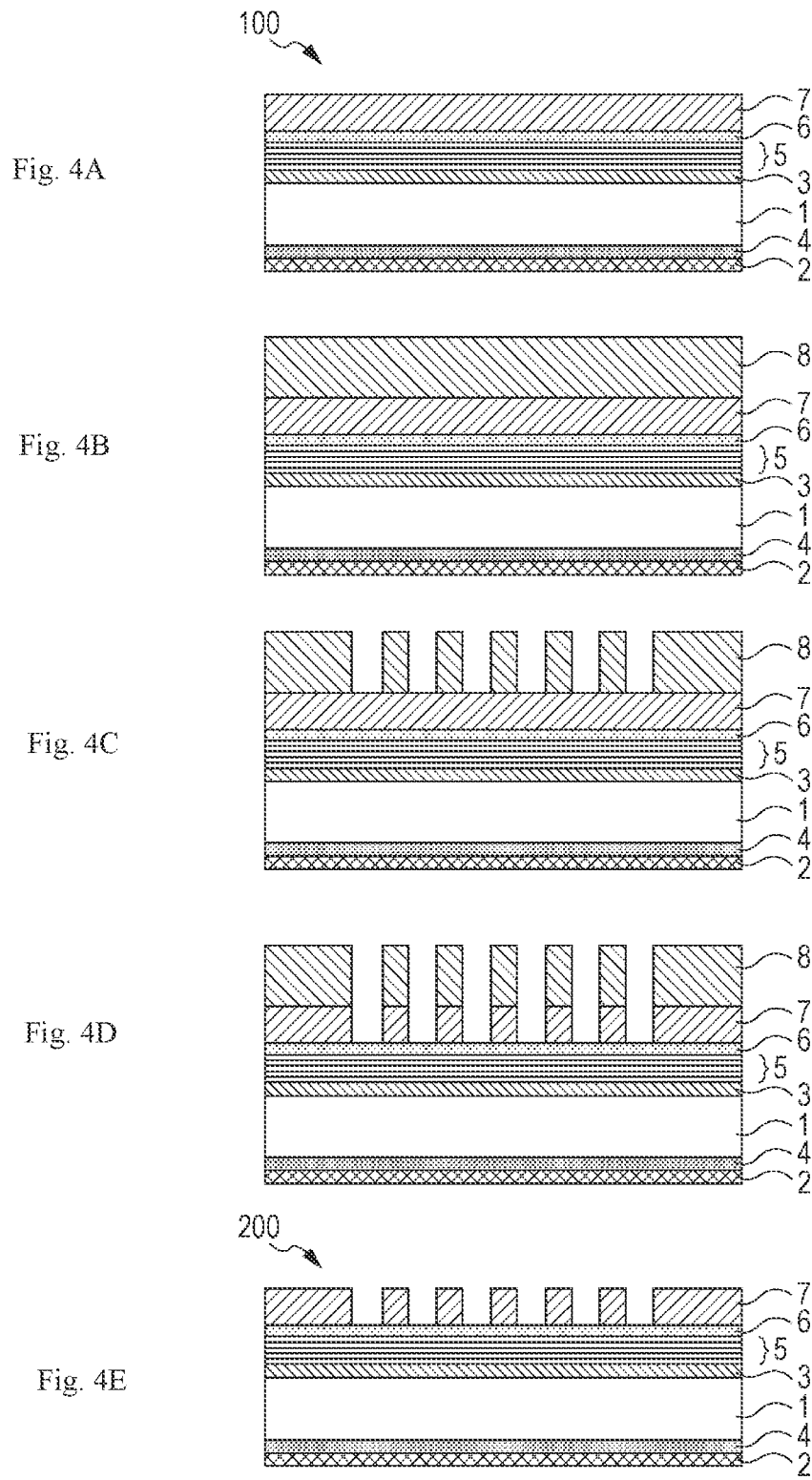

SUBSTRATE WITH MULTILAYER REFLECTIVE FILM, REFLECTIVE MASK BLANK, REFLECTIVE MASK, AND METHOD FOR MANUFACTURING SEMICONDUCTOR DEVICE

CROSS-REFERENCE TO RELATED APPLICATIONS

This application is the National Stage of International Application No. PCT/JP2020/035728, filed Sep. 23, 2020, which claims priority to Japanese Patent Application No. 2019-175851, filed on Sep. 26, 2019, and the contents of which is incorporated by reference.

TECHNICAL FIELD

The present disclosure relates to a reflective mask used for manufacturing a semiconductor device and the like, and a substrate with a multilayer reflective film and a reflective mask blank used for manufacturing the reflective mask. The present disclosure also relates to a method for manufacturing a semiconductor device using the above reflective mask.

BACKGROUND ART

In recent years, in the semiconductor industry, along with high integration of a semiconductor device, a fine pattern exceeding a transfer limit of a conventional photolithography method using ultraviolet light has been required. In order to make such fine pattern formation possible, extreme ultraviolet (hereinafter referred to as "EUV") lithography, which is an exposure technique using EUV light, is promising. Here, the EUV light refers to light in a wavelength band of a soft X-ray region or a vacuum ultraviolet region, and is specifically light having a wavelength of about 0.2 to 100 nm. A reflective mask has been proposed as a transfer mask used in this EUV lithography. In such a reflective mask, a multilayer reflective film that reflects exposure light is formed on a substrate, and an absorber film that absorbs exposure light is formed in a pattern shape on the multilayer reflective film.

Light incident on the reflective mask set in an exposure apparatus is absorbed in a portion having the absorber film, and is reflected by the multilayer reflective film in a portion having no absorber film. A reflected image is transferred onto a semiconductor substrate through a reflective optical system to form a mask pattern. As the multilayer reflective film, for example, a film in which Mo and Si each having a thickness of several nm are alternately layered is known as a film that reflects EUV light having a wavelength of 13 to 14 nm.

As a technique for manufacturing a substrate with a multilayer reflective film having such a multilayer reflective film, Patent Document 1 describes an integrated extreme ultraviolet blank production system including a vacuum chamber for disposing a substrate in a vacuum, a deposition system for depositing a multilayer stack without removing the substrate from the vacuum, and a processing system for processing a layer on the multilayer stack deposited as an amorphous metal layer. As the amorphous metal layer, amorphous molybdenum and alloying with boron, nitrogen, or carbon are described.

Patent Document 2 describes a multilayer film reflector for a soft X-ray and a vacuum ultraviolet ray having a multilayer thin film structure including alternating layers of a high absorption layer and a low absorption layer for a soft X-ray and a vacuum ultraviolet ray, in which the high absorption layer contains one or more of a boride, a carbide, a silicide, a nitride, and an oxide of a transition metal as a main component, and the low absorption layer contains one or more selected from simple substances of carbon, silicon, boron, and beryllium and compounds thereof as a main component.

Patent Document 3 describes a technique of hydrogenating an interface between layers of a multilayer reflective film to prevent interlayer diffusion and forming a smooth interface to smooth the interface and a surface of the multilayer reflective film.

Patent Document 4 describes a method for manufacturing a substrate with a reflection layer for EUV lithography (EUVL) in which a reflection layer that reflects EUV light is formed on a substrate, the reflection layer being a Mo/Si multilayer reflective film, the method including: forming the Mo/Si multilayer reflective film by a sputtering method in an atmosphere containing an inert gas containing at least one of helium (He), argon (Ar), neon (Ne), krypton (Kr), and xenon (Xe) and hydrogen ($H_2$), and heating the formed Mo/Si multilayer reflective film at a temperature of 120 to 160° C.

PRIOR ART DOCUMENTS

Patent Documents

Patent Document 1: JP 2016-519329 A
Patent Document 2: JP H07-97159 B
Patent Document 3: JP H05-297194 A
Patent Document 4: JP 2013-122952 A

SUMMARY OF DISCLOSURE

Technical Problem

An interface between layers of a multilayer reflective film and/or a surface of the multilayer reflective film are required to have higher smoothness from a viewpoint of improvement in defect quality associated with miniaturization of patterns in recent years and optical characteristics required for a reflective mask (surface reflectance of a multilayer reflective film and the like). By smoothing a surface of a substrate with a multilayer reflective film as a target of defect inspection, that is, an interface between layers of the multilayer reflective film and/or a surface of the multilayer reflective film, and reducing noise (background noise) caused by roughness of the interface between layers of the multilayer reflective film and/or roughness of the surface of the multilayer reflective film, it is possible to more reliably detect minute defects (defect signals) present in the substrate with a multilayer reflective film.

In addition, at the time of exposure using a reflective mask, exposure light is absorbed by an absorber film formed in a pattern shape, and the exposure light is reflected by the multilayer reflective film in a portion where the multilayer reflective film is exposed. In order to obtain a high contrast at the time of exposure, a reflectance of the multilayer reflective film to exposure light is desirably high.

In order to increase the reflectance of the multilayer reflective film to exposure light, it is conceivable to improve crystallinity of each layer constituting the multilayer reflective film (to increase a crystal grain size). However, when the crystal grain size is increased, noise (background level: BGL) during defect inspection increases, and there arises a problem that time required for defect inspection increases. This is because when the background level during defect inspection is too high, noise is detected as a defect, and it takes a long time to determine an actual defect contributing to transfer and a pseudo defect not contributing to transfer. In addition, since the background level during defect inspection increases, there also arises a problem that an actual defect contributing to transfer is erroneously determined as noise and is not detected. As a reason for the problem that the background level is high, it is conceivable that crystal grains become coarse, and the smoothness of the interface between layers of the multilayer reflective film and/or the surface of the multilayer reflective film deteriorates. It is conceivable that scattering of inspection light emitted during defect inspection increases due to the deterioration of the smoothness of the interface between layers of the multilayer reflective film and/or the surface of the multilayer reflective film, which increases the background level during defect inspection.

Therefore, an aspect of the present disclosure is to provide a reflective mask blank and a reflective mask each having a multilayer reflective film having a high reflectance to exposure light and a low background level during defect inspection. Another aspect of the present disclosure is to provide a substrate with a multilayer reflective film, the substrate being used in order to manufacture a reflective mask blank and a reflective mask each having a multilayer reflective film having a high reflectance to exposure light and a low background level during defect inspection. Still another aspect of the present disclosure is to provide a method for manufacturing a semiconductor device using the reflective mask.

Further still another aspect of the present disclosure is to obtain a substrate with a multilayer reflective film, a reflective mask blank, and a reflective mask capable of more reliably detecting an actual defect contributing to transfer.

Solution to Problem

In order to solve the above problems, the present disclosure has the following configurations.
(Configuration 1)
A substrate with a multilayer reflective film comprising: a substrate; and a multilayer reflective film for reflecting exposure light, the multilayer reflective film being formed of a multilayer film in which a low refractive index layer and a high refractive index layer are alternately layered on the substrate, in which
the multilayer reflective film comprises at least one additive element selected from hydrogen (H), deuterium (D), and helium (He), and
the additive element in the multilayer reflective film has an atomic number density of 0.006 atom/nm$^3$ or more and 0.50 atom/nm$^3$ or less.
(Configuration 2)
The substrate with a multilayer reflective film according to configuration 1, in which the additive element in the multilayer reflective film has an atomic number density of 0.10 atom/nm$^3$ or less.
(Configuration 3)
The substrate with a multilayer reflective film according to configuration 1 or 2, in which the additive element is deuterium (D).
(Configuration 4)
The substrate with a multilayer reflective film according to any one of configurations 1 to 3, further comprising a protective film on the multilayer reflective film.
(Configuration 5)
A reflective mask blank comprising an absorber film on the multilayer reflective film of the substrate with a multilayer reflective film according to any one of configurations 1 to 3 or on the protective film of the substrate with a multilayer reflective film according to configuration 4.
(Configuration 6)
A reflective mask comprising an absorber pattern obtained by patterning the absorber film of the reflective mask blank according to configuration 5.
(Configuration 7)
A method for manufacturing a semiconductor device, comprising performing a lithography process with an exposure apparatus using the reflective mask according to configuration 6 to form a transfer pattern on a transferred object.

Advantageous Effects of Disclosure

The present disclosure can provide a reflective mask blank and a reflective mask each having a multilayer reflective film having a high reflectance to exposure light and a low background level during defect inspection. In addition, the present disclosure can provide a substrate with a multilayer reflective film, the substrate being used in order to manufacture a reflective mask blank and a reflective mask each having a multilayer reflective film having a high reflectance to exposure light and a low background level during defect inspection. Furthermore, the present disclosure can provide a method for manufacturing a semiconductor device using the reflective mask.

In addition, the present disclosure can provide a substrate with a multilayer reflective film, a reflective mask blank, and a reflective mask capable of more reliably detecting an actual defect contributing to transfer.

BRIEF DESCRIPTION OF DRAWINGS

FIGS. 4A-4E are process diagrams illustrating a method for manufacturing a reflective mask in a schematic cross-sectional view.

DESCRIPTION OF EMBODIMENTS

Hereinafter, an embodiment of the present disclosure will be specifically described with reference to the drawings. Note that the following embodiment is one mode for specifically explaining the present disclosure and does not limit the scope of the present disclosure.

Figure 1:
FIG. 1 is a schematic cross-sectional view of an example of a substrate with a multilayer reflective film.

FIG. 1 is a schematic cross-sectional view of an example of a substrate with a multilayer reflective film 110 of an embodiment of the present disclosure. As illustrated in FIG. 1, the substrate with a multilayer reflective film 110 of the present embodiment includes a multilayer reflective film 5 on a substrate 1. The multilayer reflective film 5 is a film for reflecting exposure light, and formed of a multilayer film in which a low refractive index layer and a high refractive index layer are alternately layered. The substrate with a multilayer reflective film 110 of the present embodiment can include a conductive back film 2 on a back surface of the substrate 1 (main surface opposite to a main surface on which the multilayer reflective film 5 is formed).

Figure 2:
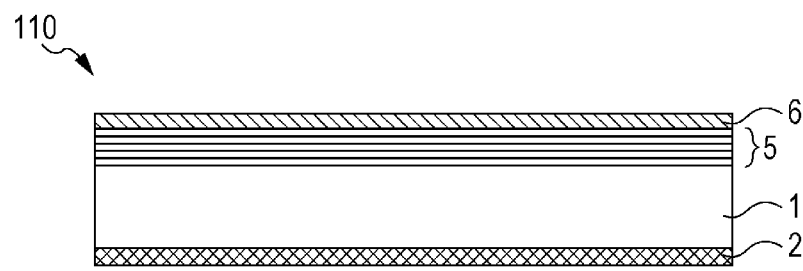
FIG. 2 is a schematic cross-sectional view of another example of the substrate with a multilayer reflective film.

FIG. 2 is a schematic cross-sectional view of another example of the substrate with a multilayer reflective film 110 of the present embodiment. In the example illustrated in FIG. 2, the substrate with a multilayer reflective film 110 includes a protective film 6.

Figure 3:
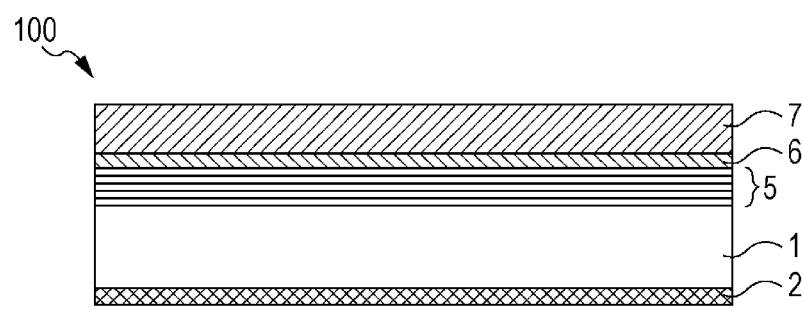
FIG. 3 is a schematic cross-sectional view of an example of a reflective mask blank.

A reflective mask blank 100 can be manufactured using the substrate with a multilayer reflective film 110 of the present embodiment. FIG. 3 is a schematic cross-sectional view of an example of the reflective mask blank 100. The reflective mask blank 100 further includes an absorber film 7.

Specifically, the reflective mask blank 100 of the present embodiment includes the absorber film 7 on the outermost surface (for example, on a surface of the multilayer reflective film 5 or the protective film 6) of the substrate with a multilayer reflective film 110. By using the reflective mask blank 100 of the present embodiment, it is possible to obtain a reflective mask 200 having the multilayer reflective film 5 having a high reflectance to EUV light.

In the present specification, the "substrate with a multilayer reflective film 110" refers to a substrate in which the multilayer reflective film 5 is formed on the predetermined substrate 1. FIGS. 1 and 2 illustrate examples of a schematic cross-sectional view of the substrate with a multilayer reflective film 110. Note that the "substrate with a multilayer reflective film 110" includes a substrate in which a thin film other than the multilayer reflective film 5, for example, the protective film 6 and/or the conductive back film 2 is formed. In the present specification, the "reflective mask blank 100" refers to one in which the absorber film 7 is formed on the substrate with a multilayer reflective film 110. Note that the "reflective mask blank 100" includes one in which a thin film (for example, an etching mask film, a resist film 8, or the like) other than the absorber film 7 is further formed.

In the present specification, the expression "disposing (forming) the absorber film 7 on the multilayer reflective film 5" includes not only a case where the absorber film 7 is disposed (formed) in contact with a surface of the multilayer reflective film 5, but also a case where another film is present between the multilayer reflective film 5 and the absorber film 7. The same applies to other films. In addition, in the present specification, for example, the expression "a film A is disposed so as to be in contact with the film B" means that the film A and the film B are disposed in direct contact with each other without another film interposed between the film A and the film B.

<Substrate with a Multilayer Reflective Film 110>

Hereinafter, the substrate 1 and each thin film constituting the substrate with a multilayer reflective film 110 of the present embodiment will be described.

<<Substrate 1>>

The substrate 1 in the substrate with a multilayer reflective film 110 of the present embodiment preferably has a small distortion of an absorber pattern due to heat during EUV exposure. Therefore, as the substrate 1, a substrate having a low thermal expansion coefficient within a range of 0±5 ppb/° C. is preferably used. As a material having a low thermal expansion coefficient within this range, for example, $SiO_2$—$TiO_2$-based glass or multicomponent-based glass ceramic can be used.

A first main surface on a side of the substrate 1 on which a transfer pattern (constituted by the absorber film 7 described later) is formed has been subjected to surface processing so as to have a predetermined flatness from a viewpoint of obtaining at least pattern transfer accuracy and position accuracy. In a case of EUV exposure, a flatness in an area having a size of 132 mm×132 mm of the main surface on the side of the substrate 1 on which the transfer pattern is formed is preferably 0.1 μm or less, more preferably 0.05 μm or less, and still more preferably 0.03 μm or less. In addition, a second main surface (back surface) opposite to the side on which the absorber film 7 is formed is a surface to be electrostatically chucked when the reflective mask is set in an exposure apparatus. A flatness in an area having a size of 142 mm×142 mm of the second main surface is preferably 0.1 μm or less, more preferably 0.05 μm or less, and still more preferably 0.03 μm or less.

In addition, a high surface smoothness of the substrate 1 is also important. A surface roughness of the first main surface on which an absorber pattern 7a is formed has a root mean square roughness (Rms) of preferably 0.15 nm or less, more preferably 0.10 nm or less. Note that the surface smoothness can be measured with an atomic force microscope.

Furthermore, the substrate 1 preferably has a high rigidity in order to prevent deformation of a film (such as the multilayer reflective film 5) formed on the substrate 1 due to film stress. In particular, the substrate 1 preferably has a high Young's modulus of 65 GPa or more.

<<Base Film>>

The substrate with a multilayer reflective film 110 of the present embodiment may have a base film 3 in contact with a surface of the substrate 1. The base film 3 is a thin film formed between the substrate 1 and the multilayer reflective film 5. The base film 3 may be a film having a function according to a purpose. For example, the base film 3 may be a conductive layer that prevents charge-up during mask pattern defect inspection using an electron beam. The base film 3 may be a flattening layer that improves a flatness of a surface of the substrate 1. The base film 3 may be a smoothing layer that improves a smoothness of a surface of the substrate 1.

As a material of the base film having the above conductive function, a material containing ruthenium or tantalum as a main component is preferably used. For example, the material of the base film may be a Ru metal simple substance or a Ta metal simple substance, or may be a Ru alloy or a Ta alloy containing Ru or Ta and at least one metal selected from titanium (Ti), niobium (Nb), molybdenum (Mo), zirconium (Zr), yttrium (Y), boron (B), lanthanum (La), cobalt (Co), and rhenium (Re). The base film preferably has a film thickness of, for example, within a range of 1 nm to 10 nm.

As a material of the base film that improves the flatness and smoothness, silicon or a material containing silicon as a main component is preferably used. The material of the base film may be, for example, a silicon (Si) simple substance or a silicon compound containing Si and oxygen (O) and/or nitrogen (N), such as Sift, $SiO_x$ (x<2), SiON, $Si_3N_4$, or $Si_xN_y$ (x: 3, y: natural number other than 4). Similarly to the above, the base film preferably has a film thickness of, for example, within a range of 1 nm to 10 nm.

<<Multilayer Reflective Film 5>>

The multilayer reflective film 5 imparts a function of reflecting EUV light in the reflective mask 200. The multilayer reflective film 5 is a multilayer film in which layers mainly containing elements having different refractive indices are periodically layered.

Generally, as the multilayer reflective film 5, a multilayer film is used in which a thin film (high refractive index layer) of a light element that is a high refractive index material or a compound of the light element and a thin film (low refractive index layer) of a heavy element that is a low refractive index material or a compound of the heavy element are alternately layered for about 40 to 60 periods (pairs).

The multilayer film used as the multilayer reflective film 5 includes a stack of "high refractive index layer/low refractive index layer" in which the high refractive index layer and the low refractive index layer are layered in this order from the substrate 1 side. By counting one stack of "high refractive index layer/low refractive index layer" as one period, the stack may be layered for a plurality of periods. Alternatively, the multilayer film used as the multilayer reflective film 5 includes a stack of "low refractive index layer/high refractive index layer" in which the low refractive index layer and the high refractive index layer are layered in this order from the substrate 1 side. By counting one stack of "low refractive index layer/high refractive index layer" as one period, the stack may be layered for a plurality of periods. Note that an outermost layer of the multilayer reflective film 5, that is, a surface layer of the multilayer reflective film 5 opposite to the substrate 1 side is preferably the high refractive index layer. In the multilayer film described above, when the high refractive index layer and the low refractive index layer are layered in this order from the substrate 1 side, the low refractive index layer is the uppermost layer. In this case, since the low refractive index layer constitutes the outermost surface of the multilayer reflective film 5, the outermost surface of the multilayer reflective film 5 is easily oxidized to reduce the reflectance of the reflective mask 200. Therefore, the high refractive index layer is preferably further formed on the low refractive index layer that is the uppermost layer. Meanwhile, in the multilayer film described above, when the low refractive index layer and the high refractive index layer are layered in this order from the substrate 1 side, the high refractive index layer is the uppermost layer. Therefore, in this case, it is not necessary to further form the high refractive index layer.

As the high refractive index layer, for example, a material containing silicon (Si) can be used. As the material containing Si, in addition to a Si simple substance, a Si compound containing Si and at least one element selected from boron (B), carbon (C), zirconium (Zr), nitrogen (N), and oxygen (O) can be used. By using the high refractive index layer containing Si, the reflective mask 200 having an excellent reflectance to EUV light can be obtained.

As the low refractive index layer, for example, at least one metal simple substance selected from molybdenum (Mo), ruthenium (Ru), rhodium (Rh), and platinum (Pt), or an alloy thereof can be used.

In the substrate with a multilayer reflective film 110 of the present embodiment, the low refractive index layer is preferably a layer containing molybdenum (Mo), and the high refractive index layer is preferably a layer containing silicon (Si). For example, as the multilayer reflective film 5 for reflecting EUV light having a wavelength of 13 nm to 14 nm, a Mo/Si periodic layered film in which a layer containing Mo and a layer containing Si are alternately layered for about 40 to 60 periods is preferably used.

Note that when the high refractive index layer that is the uppermost layer of the multilayer reflective film 5 is a layer containing silicon (Si), a silicon oxide layer containing silicon and oxygen can be formed between the uppermost layer (layer containing Si) and the protective film 6. This makes it possible to improve mask cleaning resistance.

The multilayer reflective film 5 of the present embodiment contains at least one additive element selected from hydrogen (H), deuterium (D), and helium (He). By inclusion of at least one additive element selected from hydrogen (H), deuterium (D), and helium (He) in the multilayer reflective film 5, the roughness of an interface between layers included in the multilayer reflective film 5 and/or the roughness of a surface of the multilayer reflective film 5 can be reduced to improve the smoothness. As a result, it is possible to obtain the multilayer reflective film 5 having a high reflectance to exposure light and a low background level during defect inspection. As a result, it is possible to detect minute defects (defect signals) present in the substrate with a multilayer reflective film 110 with higher accuracy.

As described above, the multilayer reflective film 5 includes a multilayer film in which the low refractive index layer and the high refractive index layer are layered. At least one additive element selected from hydrogen (H), deuterium (D), and helium (He) may be contained only in the low refractive index layer, only in the high refractive index layer, or in both of these. However, when at least one additive element selected from hydrogen (H), deuterium (D), and helium (He) is contained relatively more in the high refractive index layer than in the low refractive index layer, the effect of reducing the background level during defect inspection is higher.

The present inventor has found that there is a correlation between the atomic number density (atom/nm$^3$) of the additive element contained in the multilayer reflective film 5 and the background level during defect inspection, and sets the atomic number density of the additive element contained in the multilayer reflective film 5 of the substrate with a multilayer reflective film 110 of the present embodiment within a predetermined range. The atomic number density of the additive element contained in the multilayer reflective film 5 of the present embodiment is 0.006 atom/nm$^3$ or more and 0.50 atom/nm$^3$ or less. The atomic number density of the additive element can be measured by, for example, dynamic secondary ion mass spectrometry (SIMS).

When the atomic number density of the additive element contained in the multilayer reflective film 5 is less than 0.006 atom/nm$^3$, the density of the additive element contained in the multilayer reflective film 5 is too small, and therefore the effect of reducing the roughness of an interface between layers included in the multilayer reflective film 5 and/or the roughness of a surface of the multilayer reflective film 5 to improve the smoothness cannot be sufficiently obtained. Therefore, the multilayer reflective film 5 having a sufficiently low background level during defect inspection cannot be obtained. Meanwhile, when the atomic number density of the additive element is larger than 0.50 atom/nm$^3$, the density of the additive element contained in the multilayer reflective film 5 is too large, and therefore the reflectance of the multilayer reflective film 5 to EUV light is reduced. As a result, during exposure, a contrast of an image of a transfer pattern formed by the reflective mask may be reduced to an unacceptable level. The atomic number density of the additive element contained in the multilayer reflective film 5 is preferably 0.007 atom/nm$^3$ or more, and more preferably 0.008 atom/nm$^3$ or more. In addition, the atomic number density of the additive element is preferably 0.10 atom/nm$^3$ or less, more preferably 0.07 atom/nm$^3$ or less, and still more preferably 0.04 atom/nm$^3$ or less.

By using the substrate with a multilayer reflective film 110 of the present embodiment, it is possible to manufacture the reflective mask blank 100 and the reflective mask 200 each having the multilayer reflective film 5 having a high reflectance to exposure light and a low background level during defect inspection. Since the background level during defect inspection is low, the defect inspection can be performed in a relatively short time, and an actual defect contributing to transfer can be more reliably detected.

Note that, in general, it is difficult to calculate the atomic number density (atom/nm$^3$) of a certain element only from information of the atomic ratio (at %) of the element, and the atomic number density (atom/nm³) of the additive element contained in the multilayer reflective film 5 is not directly associated with the atomic ratio (at %) of the additive element contained in the multilayer reflective film 5. Therefore, even if the atomic ratio (at %) of the additive element is described in a certain known document, the description does not motivate adjustment of the atomic number density of the additive element within a predetermined range.

The substrate with a multilayer reflective film 110 of the present embodiment preferably has a background level (BGL) of less than 400 when defect inspection is performed on a surface of the multilayer reflective film 5 using a defect inspection apparatus. The background level (BGL) when defect inspection is performed means, for example, a background value observed as noise of a signal when defect inspection is performed on a surface of the multilayer reflective film 5 using a blanks defect inspection apparatus (actinic blank inspection (ABI)) using EUV light as inspection light. In the case of the blanks defect inspection apparatus using EUV light, the background level (BGL) is automatically calculated based on a measurement signal.

The reflectance of the multilayer reflective film 5 alone of the present embodiment to EUV light is usually preferably 67% or more. When the reflectance of the multilayer reflective film 5 is 67% or more, the multilayer reflective film 5 can be preferably used as the reflective mask 200 for manufacturing a semiconductor device. An upper limit of the reflectance is usually preferably 73%. Note that the film thicknesses and the number of periods (the number of pairs) of the low refractive index layer and the high refractive index layer constituting the multilayer reflective film 5 can be appropriately selected according to an exposure wavelength. Specifically, the film thicknesses and the number of periods (the number of pairs) of the low refractive index layer and the high refractive index layer constituting the multilayer reflective film 5 can be selected so as to satisfy the Bragg reflection law. The multilayer reflective film 5 includes the plurality of high refractive index layers and the plurality of low refractive index layers, but the film thickness does not need to be the same between the high refractive index layers and between the low refractive index layers. In addition, the film thickness of the outermost surface (for example, Si layer) of the multilayer reflective film 5 can be adjusted within a range that does not reduce the reflectance. The film thickness of the high refractive index layer (for example, Si layer) on the outermost surface is, for example, 3 nm to 10 nm.

In the substrate with a multilayer reflective film 110 of the present embodiment, the multilayer reflective film 5 includes preferably 30 to 60 periods (pairs), more preferably 35 to 55 periods (pairs), and still more preferably 35 to 45 periods (pairs) by counting a pair of the low refractive index layer and the high refractive index layer as one period (pair). As the number of periods (the number of pairs) is larger, a higher reflectance can be obtained, but time for forming the multilayer reflective film 5 is longer. By setting the period of the multilayer reflective film 5 within an appropriate range, the multilayer reflective film 5 having a relatively high reflectance can be obtained in a relatively short time.

The multilayer reflective film 5 of the present embodiment can be formed by an ion beam sputtering method or a magnetron sputtering method such as a DC sputtering method or an RF sputtering method. The multilayer reflective film 5 is preferably formed by an ion beam sputtering method from a viewpoint that impurities are hardly mixed in the multilayer reflective film 5, an ion source is independent, condition setting is relatively easy, and the like. When the multilayer reflective film 5 is formed by ion beam sputtering using a rare gas (Ar gas, Kr gas, Xe gas, or the like) and a gas containing an additive element ($H_2$ gas, $D_2$ gas, He gas, or the like) as process gases, the multilayer reflective film 5 containing the additive element can be obtained. Note that the gas containing the additive element is preferably introduced only when the high refractive index layer is formed. As a result, the multilayer reflective film 5 containing a larger amount of the additive element in the high refractive index layer than in the low refractive index layer can be formed.

In addition, the multilayer reflective film 5 of the present embodiment can also be formed using a rare gas as a process gas and a target containing the additive element. By changing the ratio of the additive element contained in the target, the atomic number density of the additive element contained in the multilayer reflective film 5 can be easily adjusted.

In the multilayer reflective film 5 of the present embodiment, the low refractive index layer preferably contains molybdenum (Mo). In this case, a peak intensity of the low refractive index layer containing Mo in X-ray diffraction by an In-plane measurement method preferably satisfies the following formula (1).

$$I_{(110)}/(I_{(110)}+I_{(200)}) \leq 0.88 \quad (1)$$

(In formula (1), $I_{(110)}$ represents a peak intensity of a (110) plane of Mo. $I_{(200)}$ represents a peak intensity of a (200) plane of Mo.)

The peak intensity of the low refractive index layer containing Mo in X-ray diffraction can be measured using, for example, an X-ray diffractometer SmartLab (manufactured by Rigaku Corporation). Measurement conditions can be, for example, conditions described in Examples described later.

Since the peak intensity of the low refractive index layer included in the multilayer reflective film 5 in X-ray diffraction satisfies the above formula (1), the substrate with a multilayer reflective film 110 including the multilayer reflective film 5 having a high reflectance to exposure light and a low background level during defect inspection can be more reliably manufactured.

<<Protective Film 6>>

In the substrate with a multilayer reflective film 110 of the present embodiment, as illustrated in FIG. 2, the protective film 6 is preferably formed on the multilayer reflective film 5. The protective film 6 is formed on the multilayer reflective film 5, and it is thereby possible to suppress damage to a surface of the multilayer reflective film 5 when the reflective mask 200 is manufactured using the substrate with a multilayer reflective film 110. As a result, a reflectance characteristic of the obtained reflective mask 200 to EUV light is favorable.

The protective film 6 can protect the multilayer reflective film 5 from damage due to dry etching and cleaning in a process of manufacturing the reflective mask 200 described later. In addition, the protective film 6 can also protect the multilayer reflective film 5 when a black defect in a mask pattern is corrected using an electron beam (EB).

FIG. 2 illustrates a case where the protective film 6 has one layer. The protective film 6 may have a stack of two layers. Alternatively, the protective film 6 may have a stack of three or more layers. When the protective film 6 has three or more layers, the lowermost layer and the uppermost layer may be, for example, layers made of a substance containing Ru. A layer between the lowermost layer and the uppermost layer may be a layer containing a metal other than Ru or an alloy thereof.

The protective film 6 contains, for example, a material containing ruthenium as a main component. Examples of the material containing ruthenium as a main component include a Ru metal simple substance, a Ru alloy containing Ru and at least one metal selected from titanium (Ti), niobium (Nb), molybdenum (Mo), zirconium (Zr), yttrium (Y), boron (B), lanthanum (La), cobalt (Co), and rhenium (Re), and a material containing a Ru metal simple substance or a Ru alloy and nitrogen.

The protective film 6 is preferably made of a Ru-based material containing Ti. When silicon is contained in the multilayer reflective film 5, by using the protective film 6 made of a Ru-based material containing Ti, a phenomenon that silicon diffuses from a surface of the multilayer reflective film 5 to the protective film 6 can be suppressed. As a result, surface roughness during mask cleaning is reduced, and film peeling is less likely to occur. By reducing the surface roughness, it is possible to prevent a decrease in reflectance of the multilayer reflective film 5 to EUV exposure light. Therefore, reduction of the surface roughness is important for improving efficiency of EUV exposure and improving throughput.

The Ru content ratio of the Ru alloy used for the protective film 6 is 50 atomic % or more and less than 100 atomic %, preferably 80 atomic % or more and less than 100 atomic %, and more preferably 95 atomic % or more and less than 100 atomic %. In particular, when the Ru content ratio of the Ru alloy is 95 atomic % or more and less than 100 atomic %, diffusion of a constituent element (for example, silicon) of the multilayer reflective film 5 to the protective film 6 can be suppressed. In addition, in this case, the protective film 6 can sufficiently ensure the reflectance of EUV light. In addition, in this case, the protective film 6 can improve mask cleaning resistance. Furthermore, the protective film 6 can function as an etching stopper when the absorber film 7 is etched. Furthermore, the protective film 6 can prevent the multilayer reflective film 5 from changing over time.

In EUV lithography, since there are few substances that are transparent to exposure light, it is not technically easy to manufacture a pellicle that prevents foreign matters from adhering to a mask pattern surface. For this reason, pellicle-less operation without using a pellicle has been the mainstream. In addition, in EUV lithography, exposure contamination such as carbon film deposition on the reflective mask 200 or an oxide film growth due to EUV exposure occurs. Therefore, it is necessary to frequently clean the reflective mask 200 and remove foreign matters and contamination on the reflective mask 200 at a stage where the reflective mask 200 is used for manufacturing a semiconductor device. For this reason, the EUV reflective mask 200 is required to have extraordinary mask cleaning resistance as compared with a transmissive mask for optical lithography. When the protective film 6 made of a Ru-based material containing Ti is used, cleaning resistance to a cleaning liquid such as sulfuric acid, sulfuric acid peroxide (SPM), ammonia, ammonia peroxide (APM), OH radical cleaning water, or ozone water having a concentration of 10 ppm or less is particularly high, and requirement for mask cleaning resistance can be satisfied.

The film thickness of the protective film 6 is not particularly limited as long as the function as the protective film 6 can be achieved. The film thickness of the protective film 6 is preferably 1.0 nm to 8.0 nm, and more preferably 1.5 nm to 6.0 nm from a viewpoint of the reflectance of EUV light.

As a method for forming the protective film 6, it is possible to adopt a known film forming method without any particular limitation. Specific examples of the method for forming the protective film 6 include a sputtering method and an ion beam sputtering method.

<Reflective Mask Blank 100 >

The reflective mask blank 100 of the present embodiment will be described. By using the reflective mask blank 100 of the present embodiment, it is possible to manufacture the reflective mask 200 having the multilayer reflective film 5 having a high reflectance to exposure light and a low background level during defect inspection.

<<Absorber Film 7>>

The reflective mask blank 100 has the absorber film 7 on the substrate with a multilayer reflective film 110 described above. That is, the absorber film 7 is formed on the multilayer reflective film 5 (on the protective film 6 when the protective film 6 is formed). A basic function of the absorber film 7 is to absorb EUV light. The absorber film 7 may be the absorber film 7 for the purpose of absorbing EUV light, or may be the absorber film 7 having a phase shift function in consideration of a phase difference of EUV light. The absorber film 7 having a phase shift function absorbs EUV light and reflects a part of the EUV light to shift a phase. That is, in the reflective mask 200 in which the absorber film 7 having a phase shift function is patterned, in a portion where the absorber film 7 is formed, a part of light is reflected at a level that does not adversely affect pattern transfer while EUV light is absorbed and attenuated. In addition, in a region (field portion) where the absorber film 7 is not formed, EUV light is reflected by the multilayer reflective film 5 via the protective film 6. Therefore, there is a desired phase difference between reflected light from the absorber film 7 having a phase shift function and reflected light from the field portion. The absorber film 7 having a phase shift function is formed such that a phase difference between reflected light from the absorber film 7 and reflected light from the multilayer reflective film 5 is 170 to 190 degrees. Beams of the light having a reversed phase difference near 180 degrees interfere with each other at a pattern edge portion, and an image contrast of a projected optical image is thereby improved. As the image contrast is improved, resolution is increased, and various exposure-related margins such as an exposure margin and a focus margin can be increased.

The absorber film 7 may be a single layer film or a multilayer film formed of a plurality of films. In a case of a single layer film, since the number of steps at the time of manufacturing the mask blank can be reduced, production efficiency is increased. In a case of a multilayer film, the upper absorber film can function as an antireflection film during mask pattern inspection using light. In this case, it is necessary to appropriately set the optical constant and the film thickness of the upper absorber film. This improves inspection sensitivity during mask pattern inspection using light. In addition, as the upper absorber film, a film containing oxygen (O), nitrogen (N), and the like capable of improving oxidation resistance can be used. This improves stability of the absorber film over time. As described above, by using the absorber film 7 formed of the multilayer film, various functions can be imparted to the absorber film 7. When the absorber film 7 has a phase shift function, a range of adjustment on an optical surface can be increased by using the absorber film 7 formed of a multilayer film. This makes it easy to obtain a desired reflectance.

A material of the absorber film 7 is not particularly limited as long as the material has a function of absorbing EUV light and can be processed by etching or the like (preferably, can be etched by dry etching with a chlorine (Cl)- or fluorine (F)-based gas). As a material having such a function, a tantalum (Ta) simple substance or a tantalum compound containing Ta as a main component can be preferably used.

The above-described absorber film 7 such as tantalum or a tantalum compound can be formed by a magnetron sputtering method such as a DC sputtering method or an RF sputtering method. For example, the absorber film 7 can be formed by a reactive sputtering method using a target containing tantalum and boron and using an argon gas containing oxygen or nitrogen.

The tantalum compound for forming the absorber film 7 includes an alloy of Ta. When the absorber film 7 is an alloy of Ta, the crystalline state of the absorber film 7 is preferably an amorphous or microcrystalline structure from a viewpoint of smoothness and flatness. If a surface of the absorber film 7 is not smooth or flat, the absorber pattern 7a may have a large edge roughness and a poor pattern dimensional accuracy. The absorber film 7 has a surface roughness of preferably 0.5 nm or less, more preferably 0.4 nm or less, still more preferably 0.3 nm or less in terms of root mean square roughness (Rms).

As the tantalum compound for forming the absorber film 7, a compound containing Ta and B, a compound containing Ta and N, a compound containing Ta, O, and N, a compound containing Ta and B and further containing at least either O or N, a compound containing Ta and Si, a compound containing Ta, Si, and N, a compound containing Ta and Ge, a compound containing Ta, Ge, and N, and the like can be used.

Ta has a large absorption coefficient of EUV light. In addition, Ta is a material that can be easily dry-etched with a chlorine-based gas or a fluorine-based gas. Therefore, Ta can be said to be a material having excellent processability for the absorber film 7. By further adding B, Si, and/or Ge, or the like to Ta, an amorphous material can be easily obtained. As a result, the smoothness of the absorber film 7 can be improved. In addition, when N and/or O is added to Ta, resistance of the absorber film 7 to oxidation is improved, and therefore stability of the absorber film 7 over time can be improved.

As the material of the absorber film 7, in addition to tantalum or a tantalum compound, at least one metal selected from palladium (Pd), silver (Ag), platinum (Pt), gold (Au), iridium (Ir), tungsten (W), chromium (Cr), cobalt (Co), manganese (Mn), tin (Sn), vanadium (V), nickel (Ni), hafnium (Hf), iron (Fe), copper (Cu), tellurium (Te), zinc (Zn), magnesium (Mg), germanium (Ge), aluminum (Al), rhodium (Rh), ruthenium (Ru), molybdenum (Mo), niobium (Nb), titanium (Ti), zirconium (Zr), yttrium (Y), and silicon (Si), or a compound thereof can be preferably used.

<<Conductive Back Film 2>>

On a second main surface (back surface) of the substrate 1 (on an intermediate layer such as a hydrogen intrusion suppressing film when the intermediate layer is formed on a surface of the substrate 1 opposite to the multilayer reflective film 5), the conductive back film 2 for an electrostatic chuck is formed. The conductive back film 2 usually has a sheet resistance of 100Ω/□ or less. The conductive back film 2 can be formed, for example, by a magnetron sputtering method or an ion beam sputtering method using a target of a metal such as chromium or tantalum or an alloy thereof. A material containing chromium (Cr) for forming the conductive back film 2 is preferably a Cr compound containing Cr and at least one selected from boron, nitrogen, oxygen, and carbon. Examples of the Cr compound include CrN, CrON, CrCN, CrCON, CrBN, CrBON, CrBCN, CrBOCN, and the like. A material containing tantalum (Ta) for forming the conductive back film 2 is preferably Ta (tantalum), an alloy containing Ta, or a Ta compound containing either Ta or an alloy containing Ta and at least one selected from boron, nitrogen, oxygen, and carbon. Examples of the Ta compound include TaB, TaN, TaO, TaON, TaCON, TaBN, TaBO, TaBON, TaBCON, TaHf, TaHfO, TaHfN, TaHfON, TaHfCON, TaSi, TaSiO, TaSiN, TaSiON, TaSiCON, and the like.

The film thickness of the conductive back film 2 is not particularly limited, but is usually 10 nm to 200 nm. The conductive back film 2 can adjust stress on the second main surface side of the mask blank 100. That is, the conductive back film 2 can balance stress generated by various films formed on the first main surface side and stress on the second main surface side. By balancing the stress on the first main surface side and the stress on the second main surface side, the reflective mask blank 100 can be adjusted to be flat.

Note that before the above-described absorber film 7 is formed, the conductive back film 2 can be formed on the substrate with a multilayer reflective film 110. In this case, the substrate with a multilayer reflective film 110 including the conductive back film 2 as illustrated in FIG. 2 can be obtained.

<Other Thin Films>

The substrate with a multilayer reflective film 110 and the reflective mask blank 100 manufactured by the manufacturing method of the present embodiment can include an etching hard mask film (also referred to as an "etching mask film") and/or the resist film 8 on the absorber film 7. Typical examples of a material of the etching hard mask film include silicon (Si), a material containing silicon and at least one element selected from oxygen (O), nitrogen (N), carbon (C), and hydrogen (H), chromium (Cr), and a material containing chromium and at least one element selected from oxygen (O), nitrogen (N), carbon (C), and hydrogen (H). Specific examples of the material include Sift, SiON, SiN, SiO, Si, SiC, SiCO, SiCN, SiCON, Cr, CrN, CrO, CrON, CrC, CrCO, CrCN, CrOCN, and the like. However, when the absorber film 7 is a compound containing oxygen, it is better to avoid a material containing oxygen (for example, $SiO_2$) as the etching hard mask film from a viewpoint of etching resistance. When the etching hard mask film is formed, the film thickness of the resist film 8 can be reduced, which is advantageous for miniaturization of a pattern.

The substrate with a multilayer reflective film 110 and the reflective mask blank 100 of the present embodiment preferably each include a hydrogen intrusion suppressing film that suppresses intrusion of hydrogen from the substrate 1 into the conductive back film 2 between a glass substrate as the substrate 1 and the conductive back film 2 containing tantalum or chromium. Presence of the hydrogen intrusion suppressing film can suppress incorporation of hydrogen into the conductive back film 2, and can suppress an increase in compressive stress of the conductive back film 2.

A material of the hydrogen intrusion suppressing film may be any type of material as long as the material hardly transmits hydrogen and can suppress intrusion of hydrogen from the substrate 1 to the conductive back film 2. Specific examples of the material of the hydrogen intrusion suppressing film include Si, $SiO_2$, SiON, SiCO, SiCON, SiBO, SiBON, Cr, CrN, CrON, CrC, CrCN, CrCO, CrCON, Mo, MoSi, MoSiN, MoSiO, MoSiCO, MoSiON, MoSiCON, TaO, TaON, and the like. The hydrogen intrusion suppressing film may be a single layer made of these materials. Alternatively, the hydrogen intrusion suppressing film may be a multilayer made of these materials, or may be a composition-gradient film made of these materials.

<Reflective Mask 200>

By patterning the absorber film 7 of the above-described reflective mask blank 100, the reflective mask 200 having the absorber pattern 7a on the multilayer reflective film 5 can be obtained. By using the reflective mask blank 100 of the present embodiment, it is possible to obtain the reflective mask 200 having the multilayer reflective film 5 having a high reflectance to exposure light and a low background level during defect inspection.

The reflective mask 200 is manufactured using the reflective mask blank 100 of the present embodiment. Here, an outline description will be only given, and a detailed description will be given later in Examples with reference to the drawings.

The reflective mask blank 100 is prepared, the resist film 8 is formed on the outermost surface of the first main surface thereof (on the absorber film 7 as described in Examples below) (this is unnecessary when the reflective mask blank 100 includes the resist film 8), and a desired pattern such as a circuit pattern is drawn (exposed) on the resist film 8 and further developed and rinsed to form a predetermined resist pattern 8a.

Using the resist pattern 8a as a mask, the absorber film 7 is dry-etched to form the absorber pattern 7a. Note that, as an etching gas, a gas selected from a chlorine-based gas such as $Cl_2$, $SiCl_4$, or $CHCl_3$, a mixed gas containing a chlorine-based gas and $O_2$ at a predetermined ratio, a mixed gas containing a chlorine-based gas and He at a predetermined ratio, a mixed gas containing a chlorine-based gas and Ar at a predetermined ratio, a fluorine-based gas such as $CF_4$, $CHF_3$, $C_2F_6$, $C_3F_6$, $C_4F_6$, $C_4F_8$, $CH_2F_2$, $CH_3F$, $C_3F_8$, $SF_6$, or $F_2$, a mixed gas containing a fluorine-based gas and $O_2$ at a predetermined ratio, and the like can be used. Here, an etching gas containing oxygen in a final stage of etching causes surface roughness of the Ru-based protective film 6. For this reason, it is preferable to use an etching gas containing no oxygen in an over-etching stage in which the Ru-based protective film 6 is exposed to etching.

Thereafter, the resist pattern 8a is removed by ashing or with a resist stripping solution to prepare the absorber pattern 7a in which a desired circuit pattern is formed.

Through the above steps, the reflective mask 200 of the present embodiment can be obtained.

<Method for Manufacturing Semiconductor Device>

A method for manufacturing a semiconductor device according to the present embodiment includes a step of performing a lithography process using an exposure apparatus using the above-described reflective mask 200 to form a transfer pattern on a transferred object.

In the present embodiment, the reflective mask 200 having the multilayer reflective film 5 having a high reflectance to exposure light and a low background level during defect inspection can be used for manufacturing a semiconductor device. As a result, throughput at the time of manufacturing a semiconductor device can be improved. Furthermore, since a semiconductor device is manufactured using the reflective mask 200 having no actual defect contributing to transfer on the multilayer reflective film 5, it is possible to suppress a decrease in yield of the semiconductor device due to a defect of the multilayer reflective film 5.

Specifically, by performing EUV exposure using the reflective mask 200 of the present embodiment, a desired transfer pattern can be formed on a semiconductor substrate. Through various steps such as etching of a film to be processed, formation of an insulating film or a conductive film, introduction of a dopant, and annealing in addition to this lithography process, it is possible to manufacture a semiconductor device in which a desired electronic circuit is formed at a high yield.

EXAMPLES

Hereinafter, Examples and Comparative Examples will be described with reference to the drawings. Note that in Examples, the same reference signs will be used for similar constituent elements, and the description thereof will be simplified or omitted.

As illustrated in FIG. 1, the substrate with a multilayer reflective film 110 of Examples includes the substrate 1 and the multilayer reflective film 5.

First, the 6025 size (about 152 mm×152 mm×6.35 mm) substrate 1 in which the first main surface and the second main surface were polished was prepared. The substrate 1 is a substrate made of low thermal expansion glass ($SiO_2$—$TiO_2$-based glass). The main surfaces of the substrate 1 were polished through a rough polishing step, a precision polishing step, a local processing step, and a touch polishing step.

Next, the multilayer reflective film 5 was formed on the main surface (first main surface) of the substrate 1. The multilayer reflective film 5 formed on the substrate 1 was the periodic multilayer reflective film 5 including Mo and Si in order to make the multilayer reflective film 5 suitable for EUV light having a wavelength of 13.5 nm. The multilayer reflective film 5 was formed by alternately building up a Mo film and a Si film on the substrate 1 using a Mo target and a Si target by an ion beam sputtering method using a predetermined process gas and a predetermined target. First, a Si film was formed with a thickness of 4.2 nm, and then a Mo film was formed with a thickness of 2.8 nm. This stack was counted as one period, and the Si film and the Mo film were built up for 40 periods in a similar manner. Finally, the Si film was formed with a thickness of 4.0 nm to form the multilayer reflective film 5.

The multilayer reflective films 5 of the present Examples were formed by adjusting a gas flow rate and/or a gas pressure of a process gas such that H, D, or He had a predetermined atomic number density. Tables 1, 2, and 3 present process gases used for forming the multilayer reflective films 5 of Examples and Comparative Examples. In Examples 1 to 6 and 9 to 11 and Comparative Example 2, hydrogen ($H_2$) was introduced into the multilayer reflective film 5 by using $H_2$ gas in addition to Kr gas at the time of forming the multilayer reflective film 5. In Example 7, deuterium ($D_2$) was introduced into the multilayer reflective film 5 by using $D_2$ gas in addition to Kr gas at the time of forming the multilayer reflective film 5. In Example 8, helium (He) was introduced into the multilayer reflective film 5 by using He gas in addition to Kr gas at the time of forming the multilayer reflective film 5. In Comparative Example 1, only Kr gas was used at the time of forming the multilayer reflective film 5.

<<Atomic Number Density>>

The atomic number density (atom/$nm^3$) of the additive element (H, D, or He) contained in each of the multilayer reflective films 5 of the substrates with a multilayer reflective film 110 obtained in Example 1 to 11 and Comparative Examples 1 and 2 was measured by dynamic SIMS (quadrupole secondary ion mass spectrometer: PHI ADEPT-1010™, manufactured by ULVAC-PHI, Inc.). As measurement conditions, a primary ion species was $Cs^+$, a primary acceleration voltage was 1.0 kV, a primary ion irradiation region was 90 μm square, a secondary ion polarity was positive, and a detection secondary ion species was [Cs—H]$^+$ [Cs-D]$^+$, or [Cs-He]$^+$. In addition, a standard sample was Si. Measurement results are presented in Tables 1, 2, and 3.

<<Background Level (BGL)>>

Defect inspection was performed on the substrates with a multilayer reflective film 110 obtained in Example 1 to 11 and Comparative Examples 1 and 2, and a background level (BGL) of each of the multilayer reflective films 5 was measured. The background level (BGL) can be automatically measured by a defect inspection apparatus for inspecting a defect in the multilayer reflective film 5. As the defect inspection apparatus, a blanks defect inspection apparatus (actinic blank inspection) using EUV light as inspection light was used. Measurement results of the BGL are presented in Tables 1, 2, and 3.

<<Reflectance>>

A reflectance of each of the multilayer reflective films 5 of the substrates with a multilayer reflective film 110 of Examples 1 to 11 and Comparative Examples 1 and 2 to EUV light having a wavelength of 13.5 nm was measured. Measurement results of the reflectance are presented in Tables 1, 2, and 3.

As presented in Tables 1, 2, and 3, each of the substrates with a multilayer reflective film 110 of Examples 1 to 11 containing at least one additive element selected from hydrogen (H), deuterium (D), and helium (He) in the multilayer reflective film 5 had a high reflectance of 67% or more and a sufficiently low background level of less than 400 during defect inspection.

Meanwhile, the substrate with a multilayer reflective film 110 of Comparative Example 1 containing no additive element in the multilayer reflective film 5 had a high reflectance of 67% or more, but had a background level of more than 400 during defect inspection. The substrate with a multilayer reflective film 110 of Comparative Example 2 containing a large amount of the additive element had a background level of less than 400 during defect inspection, but had a low reflectance of less than 67%.

<<Measurement of X-Ray Diffraction Peak Intensity>>

X-ray diffraction measurement by an in-plane measurement method was performed on the multilayer reflective films 5 of the substrates with a multilayer reflective film 110 obtained in Examples 1 to 8 and Comparative Example 1. Specifically, a sample was irradiated with a CuKα characteristic X-ray generated by a voltage of 45 kV and a current of 200 mA using an X-ray diffractometer SmartLab (manufactured by Rigaku Corporation), and the intensity and diffraction angle (2θ) of a diffracted X-ray were measured to obtain diffraction peaks of the diffracted X-ray corresponding to a (110) plane and a (200) plane of Mo contained in the low refractive index layer. By measuring the area of the peak, peak intensity $I_{(200)}$ of the (110) plane of Mo and peak intensity $I_{(200)}$ of the (200) plane of Mo were measured. At this time, processing such as subtraction of a predetermined background was performed using software attached to the measurement apparatus. Measurement results of the peak intensity are presented in Tables 1 and 2.

As presented in Tables 1 and 2, in the substrates with a multilayer reflective film 110 of Examples 1 to 8, the peak intensities $I_{(200)}$ and $I_{(200)}$ satisfied $I_{(110)}/(I_{(110)}+I_{(200)}) \leq 0.88$. Meanwhile, in the substrate with a multilayer reflective film 110 of Comparative Example 1, the peak intensities $I_{(200)}$ and $I_{(200)}$ were $I_{(110)}/(I_{(110)}+I_{(200)})=0.891$, and did not satisfy the above-described formula (1).

Note that, in Example 1 to 8 described above, an example has been described in which the multilayer reflective film 5 is formed of a multilayer film in which Mo and Si are periodically layered. However, even when the multilayer reflective film 5 is formed of a multilayer film containing an element other than Mo and Si, the above-described action and effect can be obtained. That is, even when the multilayer reflective film 5 is formed of a multilayer film containing an element other than Mo and Si, by inclusion of at least one additive element selected from hydrogen (H), deuterium (D), and helium (He) in the multilayer reflective film 5, the substrate with a multilayer reflective film 110 having a high reflectance to exposure light and a background level of less than 400 during defect inspection can be obtained. In addition, even when the multilayer reflective film 5 is formed of a multilayer film containing an element other than Mo and Si, it is possible to obtain the substrate with a multilayer reflective film 110 in which a peak intensity ratio of Mo contained in the low refractive index layer in X-ray diffraction satisfies $I_{(110)}/(I_{(110)}+I_{(200)}) \leq 0.88$.

<Reflective Mask Blank 100>

Each of the substrates with a multilayer reflective film 110 of Examples 1 to 8 and Comparative Example 1 has the multilayer reflective film 5 having a high reflectance of 67% or more to EUV light having a wavelength of 13.5 nm as exposure light. However, the substrate with a multilayer reflective film 110 of Comparative Example 1 had a high background level of 400 or more during defect inspection, and therefore had a long time required for defect inspection. In addition, since the background level during defect inspection is such a high value of 400 or more, there is a risk that the substrate with a multilayer reflective film 110 determined not to include an actual defect contributing to transfer includes an actual defect.

Therefore, the reflective mask blank 100 can be manufactured using each of the substrates with a multilayer reflective film 110 of Examples 1 to 8 having a high reflectance (67% or more) and a low background level (less than 400). Hereinafter, a method for manufacturing the reflective mask blank 100 using each of the substrates with a multilayer reflective film 110 of Examples 1 to 8 will be described.

The protective film 6 was formed on a surface of each of the substrates with a multilayer reflective film 110 of Examples 1 to 8. The protective film 6 made of Ru was formed so as to have a film thickness of 2.5 nm by a DC sputtering method using a Ru target in an Ar gas atmosphere.

Next, a TaBN film having a film thickness of 62 nm was formed as the absorber film 7 by a DC sputtering method. The TaBN film was formed by a reactive sputtering method using a TaB mixed sintered target in a mixed gas atmosphere of Ar gas and $N_2$ gas.

An element ratio of the TaBN film was 75 atomic % for Ta, 12 atomic % for B, and 13 atomic % for N. A refractive index n of the TaBN film at a wavelength of 13.5 nm was about 0.949, and an extinction coefficient k thereof was about 0.030.

Next, the conductive back film 2 made of CrN was formed on the second main surface (back surface) of the substrate 1 by a magnetron sputtering (reactive sputtering) method under the following conditions.

Conditions for forming the conductive back film 2: a Cr target, a mixed gas atmosphere of Ar and $N_2$ (Ar: 90 atomic %, N: 10 atomic %), and a film thickness of 20 nm.

As described above, the reflective mask blank 100 in which the multilayer reflective film 5 had a high reflectance and a low background level during defect inspection was manufactured.

<Reflective Mask 200>

Next, the reflective mask 200 was manufactured using the reflective mask blank 100 described above. A method for manufacturing the reflective mask 200 will be described with reference to FIGS. 4A-4E.

First, as illustrated in FIG. 4B, the resist film 8 was formed on the absorber film 7 of the reflective mask blank 100. Then, a desired pattern such as a circuit pattern was drawn (exposed) on this resist film 8 and further developed and rinsed to form the predetermined resist pattern 8a (FIG. 4C). Next, using the resist pattern 8a as a mask, the absorber film 7 (TaBN film) was dry-etched using $Cl_2$ gas to form the absorber pattern 7a (FIG. 4D). The protective film 6 made of Ru had extremely high dry etching resistance to $Cl_2$ gas, and served as a sufficient etching stopper. Thereafter, the resist pattern 8a was removed by ashing, with a resist stripping solution, or the like (FIG. 4E).

<Manufacture of Semiconductor Device>

The reflective mask 200 manufactured as described above was set in an EUV scanner, and EUV exposure was performed on a wafer on which a film to be processed and a resist film were formed on a semiconductor substrate. Then, this resist film that had been subjected to exposure was developed to form a resist pattern on the semiconductor substrate on which the film to be processed was formed.

This resist pattern was transferred onto the film to be processed by etching, and through various steps such as formation of an insulating film and a conductive film, introduction of a dopant, and annealing, a semiconductor device having desired characteristics could be manufactured at a high yield.

TABLE 1

| | Process gas | Atomic number density of H contained in multilayer reflective film (atom/nm³) | BGL | Reflectance (%) | $I_{(110)}$ | $I_{(200)}$ | $I_{(110)}/$ $I_{(110)} +$ $I_{(200)}$ |
|---|---|---|---|---|---|---|---|
| Example 1 | Kr, $H_2$ | 0.0237 | 285 | 68.98 | 1025 | 453 | 0.694 |
| Example 2 | Kr, $H_2$ | 0.0152 | 326 | 68.98 | 1246 | 349 | 0.781 |
| Example 3 | Kr, $H_2$ | 0.0138 | 336 | 68.97 | 1245 | 319 | 0.796 |
| Example 4 | Kr, $H_2$ | 0.0093 | 358 | 69.00 | 1322 | 281 | 0.825 |
| Example 5 | Kr, $H_2$ | 0.0083 | 371 | 68.98 | 1396 | 230 | 0.859 |
| Example 6 | Kr, $H_2$ | 0.0073 | 385 | 68.98 | 1421 | 224 | 0.864 |
| Comparative Example 1 | Kr | 0.0058 | 407 | 68.99 | 1551 | 189 | 0.891 |

TABLE 2

| | Process gas | Atomic number density of D or He contained in multilayer reflective film (atom/nm³) | BGL | Reflectance (%) | $I_{(110)}$ | $I_{(200)}$ | $I_{(110)}/$ $I_{(110)} +$ $I_{(200)}$ |
|---|---|---|---|---|---|---|---|
| Example 7 | Kr, $D_2$ | 0.0242 | 281 | 68.97 | 1011 | 467 | 0.684 |
| Example 8 | Kr, He | 0.0080 | 364 | 69.00 | 1345 | 275 | 0.830 |

TABLE 3

|  | Process gas | Atomic number density of H contained in multilayer reflective film (atom/nm³) | BGL | Reflectance (%) |
|---|---|---|---|---|
| Example 9 | Kr, H₂ | 0.0424 | 238 | 68.78 |
| Example 10 | Kr, H₂ | 0.0651 | 198 | 68.70 |
| Example 11 | Kr, H₂ | 0.0970 | 176 | 68.52 |
| Comparative Example 2 | Kr, H₂ | 0.610 | 102 | 66.87 |

REFERENCE SIGNS LIST

1 Substrate
2 Conductive back film
5 Multilayer reflective film
6 Protective film
7 Absorber film
7a Absorber pattern
8 Resist film
8a Resist pattern
100 Reflective mask blank
110 Substrate with a multilayer reflective film
200 Reflective mask

The invention claimed is:

1. A reflective mask blank comprising:
a substrate; a multilayer reflective film for reflecting exposure light, the multilayer reflective film on the substrate, and an absorber film on the multilayer reflective film, wherein:
the multilayer reflective film comprises a multilayer film in which a low refractive index layer and a high refractive index layer are alternately layered, and an uppermost layer on the multilayer film,
the low refractive index layer comprises molybdenum (Mo),
the high refractive index layer and the uppermost layer comprise silicon (Si),
the multilayer film is formed by sputtering in the presence of at least one additive element selected from hydrogen (H), and deuterium (D), and
the additive element in the multilayer film corresponding to a region where a transfer pattern is formed has an atomic number density of 0.006 atom/nm³ or more and 0.0424 atom/nm³ or less.

2. The reflective mask blank according to claim 1, wherein the additive element is deuterium (D).

3. The reflective mask blank according to claim 2, further comprising a protective film on the multilayer reflective film.

4. The reflective mask blank according to claim 1, further comprising a protective film on the multilayer reflective film.

5. A reflective mask comprising:
a substrate; a multilayer reflective film for reflecting exposure light, the multilayer reflective film on the substrate, and an absorber pattern on the multilayer reflective film, wherein:
the multilayer reflective film comprises a multilayer film in which a low refractive index layer and a high refractive index layer are alternately layered, and an uppermost layer on the multilayer film,
the low refractive index layer comprises molybdenum (Mo),
the high refractive index layer and the uppermost layer comprise silicon (Si),
the multilayer film is formed by sputtering in the presence of at least one additive element selected from hydrogen (H), and deuterium (D), and
the additive element in the multilayer film corresponding to a region where a transfer pattern is formed has an atomic number density of 0.006 atom/nm³ or more and 0.0424 atom/nm³ or less.

6. The reflective mask according to claim 5, wherein the additive element is deuterium (D).

7. The reflective mask according to claim 6, further comprising a protective film on the multilayer reflective film.

8. The reflective mask according to claim 5, further comprising a protective film on the multilayer reflective film.

9. A method for manufacturing a semiconductor device, comprising performing a lithography process with an exposure apparatus using the reflective mask according to claim 5 to form a transfer pattern on a transferred object.

10. The method according to claim 9, wherein the additive element is deuterium (D).

11. The method according to claim 10, further comprising a protective film on the multilayer reflective film.

12. The method according to claim 9, further comprising a protective film on the multilayer reflective film.

* * * * *